(12) United States Patent (10) Patent No.: US 9,311,180 B2
Takahashi (45) Date of Patent: Apr. 12, 2016

(54) SEMICONDUCTOR STORAGE CIRCUIT AND OPERATION METHOD THEREOF

(71) Applicant: Renesas Electronics Corporation, Kawasaki-shi (JP)

(72) Inventor: Hiroyuki Takahashi, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 242 days.

(21) Appl. No.: 13/921,112

(22) Filed: Jun. 18, 2013

(65) Prior Publication Data

US 2014/0013184 A1 Jan. 9, 2014

(30) Foreign Application Priority Data

Jul. 9, 2012 (JP) ................... 2012-153557

(51) Int. Cl.
*G06F 11/10* (2006.01)
*G11C 29/04* (2006.01)

(52) U.S. Cl.
CPC ............ *G06F 11/1008* (2013.01); *G06F 11/10* (2013.01); *G06F 11/1048* (2013.01); *G11C 2029/0411* (2013.01)

(58) Field of Classification Search
CPC .................................................. G06F 11/1008
USPC .................................................. 714/773, 774
See application file for complete search history.

(56) References Cited

U.S. PATENT DOCUMENTS

| 3,809,884 A | * | 5/1974 | Nibby et al. ................. 714/48 |
| 4,570,217 A | * | 2/1986 | Allen et al. .................. 700/83 |
| 5,748,914 A | * | 5/1998 | Barth et al. ................. 710/105 |
| 5,864,569 A | * | 1/1999 | Roohparvar ................. 714/773 |
| 5,917,760 A | * | 6/1999 | Millar ......................... 365/194 |
| 6,044,429 A | * | 3/2000 | Ryan et al. .................. 710/305 |
| 6,121,815 A | * | 9/2000 | Terada et al. ............... 327/292 |
| 6,285,626 B2 | * | 9/2001 | Mizuno et al. .......... 365/233.12 |
| 6,427,197 B1 | * | 7/2002 | Sato et al. ................... 711/169 |

(Continued)

FOREIGN PATENT DOCUMENTS

| JP | 2000-137983 A | 5/2000 |
| JP | 2002-74983 A | 3/2002 |

(Continued)

OTHER PUBLICATIONS

Japanese Office Action dated Dec. 8, 2015 with an English translation.

*Primary Examiner* — Joseph D Torres
(74) *Attorney, Agent, or Firm* — McGinn IP Law Group, PLLC

(57) ABSTRACT

A semiconductor storage circuit includes a memory core which includes multiple memory cells; an error checking and correction (ECC) encoder; and an ECC decoder. The memory core is activated in response to input of a command for each operation cycle. The ECC encoder performs ECC encoding of input data which is input together with a write command and thus generates ECC data, and generates write data including the input data and the ECC data. The ECC decoder performs ECC decoding of read data which has been read from the memory core according to a read command, using ECC data included in the read data, and thus generates output data. An adjustment is made to equalize a delay from input of a write command until activation of the memory core and a delay from input of a read command until activation of the memory core.

14 Claims, 12 Drawing Sheets

(56) References Cited

U.S. PATENT DOCUMENTS

| | | | |
|---|---|---|---|
| 6,977,858 B2 | 12/2005 | Osada et al. | |
| 7,464,320 B2 | 12/2008 | Nagai et al. | |
| 7,984,363 B2 | 7/2011 | Kushida | |
| 8,190,808 B2* | 5/2012 | Lai et al. | 711/5 |
| 8,352,805 B2* | 1/2013 | Shaeffer et al. | 714/53 |
| 2001/0003514 A1* | 6/2001 | Mizuno et al. | 365/233 |
| 2001/0038565 A1* | 11/2001 | Matsuzaki | 365/222 |
| 2001/0052102 A1* | 12/2001 | Roohparvar | 714/773 |
| 2001/0055226 A1* | 12/2001 | Miura et al. | 365/194 |
| 2003/0009721 A1* | 1/2003 | Hsu et al. | 714/773 |
| 2004/0039883 A1* | 2/2004 | LaBerge et al. | 711/155 |
| 2004/0044943 A1* | 3/2004 | Jacquet et al. | 714/763 |
| 2005/0007814 A1* | 1/2005 | Spencer et al. | 365/158 |
| 2006/0056258 A1* | 3/2006 | Eto | 365/222 |
| 2006/0179183 A1* | 8/2006 | Brittain et al. | 710/35 |
| 2006/0200728 A1 | 9/2006 | Nagai et al. | |
| 2007/0198902 A1* | 8/2007 | Toda | 714/782 |
| 2007/0260964 A1* | 11/2007 | Origasa et al. | 714/773 |
| 2008/0052564 A1* | 2/2008 | Yim et al. | 714/699 |
| 2009/0125787 A1* | 5/2009 | Sakimura et al. | 714/764 |
| 2009/0141544 A1* | 6/2009 | Sakimura et al. | 365/158 |
| 2009/0319871 A1* | 12/2009 | Shirai | G06F 11/1068 714/773 |
| 2010/0110803 A1* | 5/2010 | Arai | 365/189.05 |

FOREIGN PATENT DOCUMENTS

| | | |
|---|---|---|
| JP | 2004-213719 A | 7/2004 |
| JP | 2006-244632 A | 9/2006 |
| JP | 2007-272981 A | 10/2007 |
| JP | 2007-328894 A | 12/2007 |
| JP | 2008-90419 A | 4/2008 |
| JP | 2010-86210 A | 4/2010 |

* cited by examiner

SEMICONDUCTOR STORAGE CIRCUIT AND
OPERATION METHOD THEREOF

CROSS-REFERENCE TO RELATED
APPLICATIONS

The disclosure of Japanese Patent Application No. 2012-153557 filed on Jul. 9, 2012 including the specification, drawings and abstract is incorporated herein by reference in its entirety.

BACKGROUND

The present invention relates to a semiconductor storage circuit and an operation method thereof and particularly to an operation method of a semiconductor storage circuit having an error checking and correction (ECC) function.

The ECC function that detects and corrects an error in stored data is widely used as a technique for enhancing data reliability of a semiconductor storage circuit. Recently, not only an independent memory chip, also a memory macro integrated into an LSI with embedded memory may be equipped with the ECC function.

A memory macro equipped with the ECC function is disclosed in, e.g., Japanese Unexamined Patent Application Publication No. 2010-086120. FIG. 1 presents a configuration of a controller 16 disclosed in this publication. The controller 106 includes a memory 101, a memory controller 102, and a processor 104. The memory 101 and the memory controller 102 are connected by a set of signal lines 103. The memory controller 102 and the processor 104 are connected by a set of signal lines 105. When the processor 104 commands the memory controller 102 to initiate a read or write operation by control signals (clock CLK, read/write control RW, transfer start BS, and address and data AD) which are transmitted through the set of signal lines 105, the memory controller 102 gets access to the memory 101 (and executes the read or write operation) by control signals (clock CLK, address A, row address strobe RAS, column address strobe CAS, write enable WE, data mask DM, data strobe DQS, and data DQ) which are transmitted through the set of signal lines 103. The memory controller 102 has the ECC function and performs ECC encoding and ECC decoding.

Other memory macros equipped with the ECC function are disclosed in Japanese Unexamined Patent Application Publications No. 2002-74983, No. 2006-244632, and No. 2008-90419.

One requirement imposed on a semiconductor storage device is to increase its operating frequency for read and write operations. By increasing the operating frequency, read and write operations at a higher speed can be achieved.

Another requirement is to maintain complete random accessibility in each operation cycle including switching between a read operation and a write operation. For example, a situation in which a read operation is prohibited in an operation cycle following a cycle of a write operation commanded complicates a control logic that is used for externally controlling the semiconductor storage circuit and results in a decrease in the random accessibility.

However, the addition of the ECC function may make it impossible to satisfy the foregoing requirements together. For example, a higher operating frequency, if applied, may make it impossible to complete ECC encoding and writing into a memory cell in one operation cycle and, similarly, may make it impossible to complete reading from a memory cell and ECC decoding in one operation cycle. Under a condition that ECC processing (that is, ECC encoding or ECC decoding) and access to a memory cell should be completed in a single operation cycle, the operating frequency is restricted to a frequency that is consistent with the sum of a time taken for the ECC processing and a time taken for the access to the memory cell.

One method for coping with such a problem is pipelining of processing for memory access and ECC encoding or ECC decoding, as disclosed in, e.g., Japanese Unexamined Patent Application Publication No. 2010-086120 mentioned above. That is, for a write operation, ECC encoding is performed in an operation cycle beginning with the input of a write command, data, and an address, and the data is written into a memory core in the next operation cycle. For a read operation, data is read from the memory core in an operation cycle beginning with the input of a read command and an address, and ECC decoding is performed in the next operation cycle. In this way of operation, the length of one operation cycle can be shortened and, thus, ECC processing can be performed without a decrease in the operating frequency.

FIG. 2 is a timing chart presenting an example of a write operation and a read operation of the semiconductor storage circuit of FIG. 1. An operation sequence in which ECC processing and memory access are pipelined, as noted above, is illustrated in FIG. 2. Here, note the following. The memory controller 102 in the circuit of FIG. 1 is configured to transfer an address received from the processor 104 directly to the memory 101 and, at the same time, perform ECC processing. In consequence, operations are to take place such that ECC encoding is performed in an operation cycle beginning with the input of a write command, data, and an address, and the data is written into the memory core in the next operation cycle.

In the operation sequence of FIG. 2, for example, at a time instant t1, when a write command is input, an address signal specifying an address A1 is input, and data D1 is input to a data input, ECC processing is performed in an operation cycle starting from the time instant t1. In the next operation cycle (starting at a time instant t2), the memory 101 is activated and writing of the data is performed. At a time instant t3, when a read command is input and an address signal specifying an address A2 is input, the memory 101 is activated and reading of data is performed in an operation cycle starting from the time instant t3. In the next operation cycle (starting at a time instant t4), ECC decoding is performed.

However, in the operation sequence illustrated in FIG. 2, the number of write cycles (the number of operation cycles required to complete data writing after the input of a write command) degrades to 2. The number of read cycles (the number of operation cycles required to complete data reading after the input of a read command) also degrades to 2.

In addition, in the operation sequence illustrated in FIG. 2, it is necessary to prohibit input of a read command in an operation cycle following the cycle beginning with the input of a write command and random accessibility is lost. Access to the memory 101 for a writing operation takes place in an operation cycle following the operation cycle beginning with the input of a write command, whereas access to the memory 101 for a read operation takes place in an operation cycle beginning with the input of a read command. Hence, if a read command is input in the operation cycle following the cycle beginning with the input of a write command, collision of access to the memory 101 would occur.

In order to resolve such a trouble, it is conceivable that access to the memory 101 is made to take place in an operation cycle following the operation cycle beginning with the input of a read command, thus avoiding access collision. However, in such an operation sequence, the number of read cycles increases to 3.

Such a problem becomes an issue particularly for an LSI with embedded memory. Because a memory interface is not a bottleneck for an LSI with embedded memory, the operating speed of a memory core is increased and, besides, there is a large requirement for random access performance. Therefore, the problem of an increase in the number of cycles required for a write operation and a read operation and the problem of restriction of input timing of a write command and a read command become particularly serious.

SUMMARY

Therefore, an object of the present invention is to provide a technique for maintaining a high operating frequency and enhancing random accessibility of a semiconductor storage circuit having the ECC function.

In one aspect of the present invention, a semiconductor storage circuit includes a memory core which includes multiple memory cells; an error checking and correction (ECC) encoder; and an ECC decoder. The memory core is activated in response to input of a command for each operation cycle. The ECC encoder performs ECC encoding of input data which is input together with a write command and thus generates ECC data, and generates write data including the input data and the ECC data. The ECC decoder performs ECC decoding of read data which has been read from the memory core according to a read command, using ECC data included in the read data, and thus generates output data. An adjustment is made to equalize a delay from input of a write command until activation of the memory core and a delay from input of a read command until activation of the memory core. Timing of writing of write data into the memory core is adjusted so as to equalize a delay from input of a write command until activation of the memory core and a delay from input of a read command until activation of the memory core.

In another aspect of the present invention, there is provided an operation method of a semiconductor storage circuit including a memory core including multiple memory cells. The operation method includes the steps of:

activating the memory core in response to input of a command for each operation cycle;

when a write command is input as the command for a first operation cycle of each operation cycle, performing error checking and correction (ECC) encoding of input data which has been input for the first operation cycle and thus generating ECC data, and generating write data including the input data and the ECC data;

writing the write data into a memory cell addressed by a write address which has been input for the first operation cycle during the activation of the memory core;

when a read command is input as the commend for a second operation cycle of each operation cycle, reading data to be read from a memory cell addressed by a read address which has been input for the second operation cycle; and performing ECC decoding of the thus read data using ECC data included in the read data and thus generating output data.

A delay from input of a write command until activation of the memory core is equal to a delay from input of a read command until activation of the memory core.

According to the aspects of the present invention, there is provided a technique for maintaining a high operating frequency and enhancing random accessibility of a semiconductor storage circuit having the ECC function.

DETAILED DESCRIPTION

First Embodiment

Figure 1:
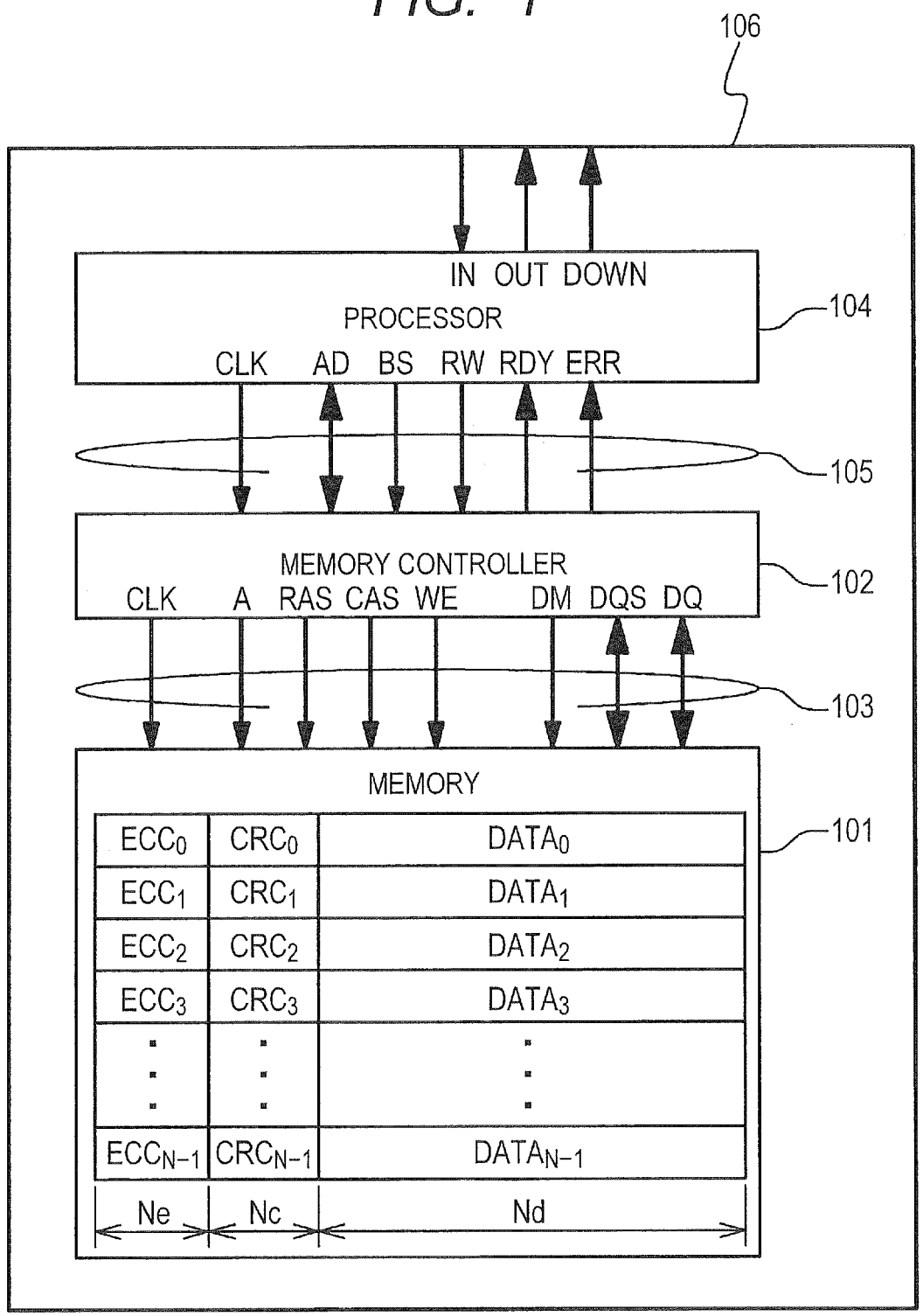
FIG. 1 is a block diagram presenting a configuration of a hitherto known semiconductor storage circuit having an ECC function.
Figure 2:
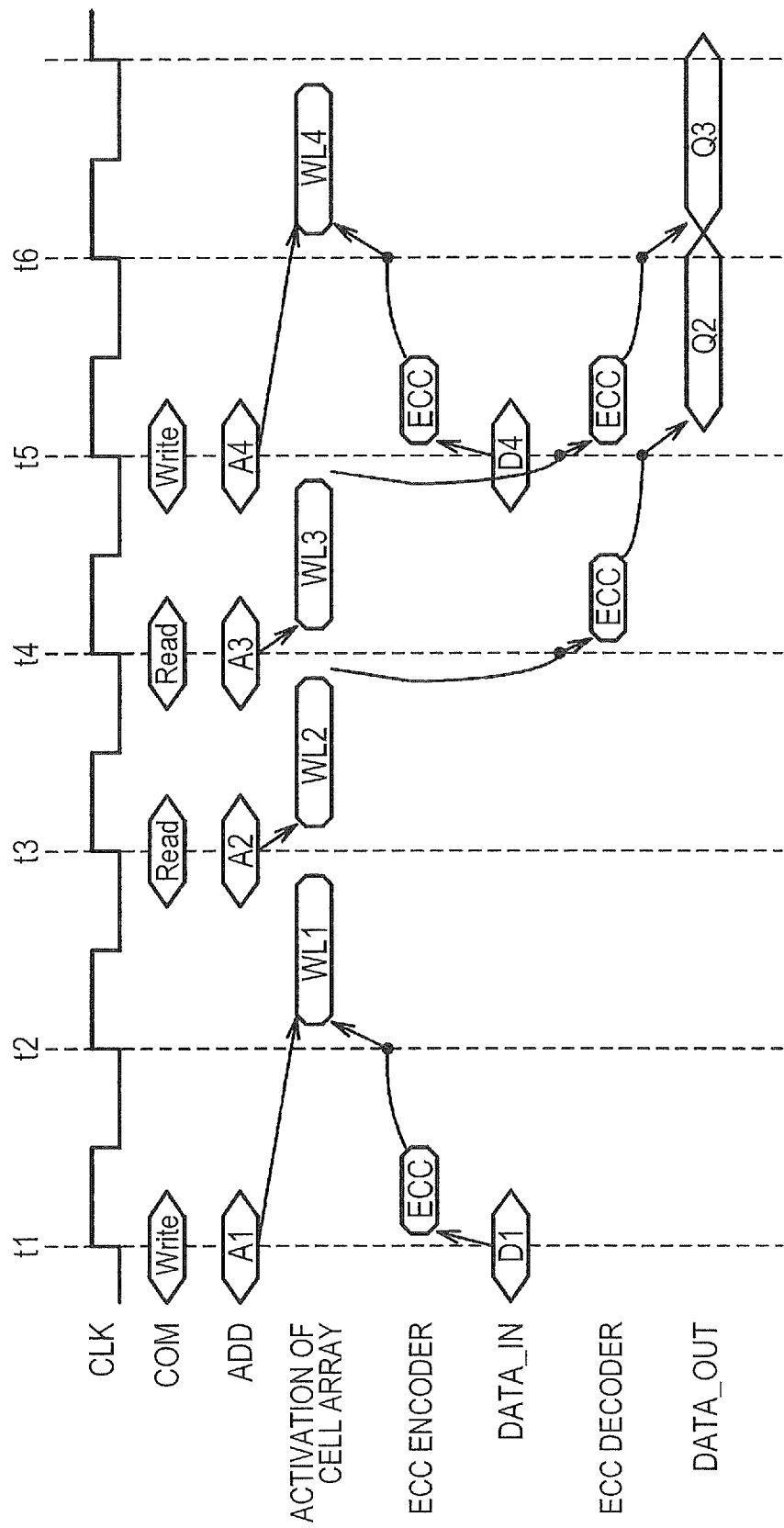
FIG. 2 is a timing chart illustrating an operation sequence of the semiconductor storage circuit of FIG. 1.
Figure 3:
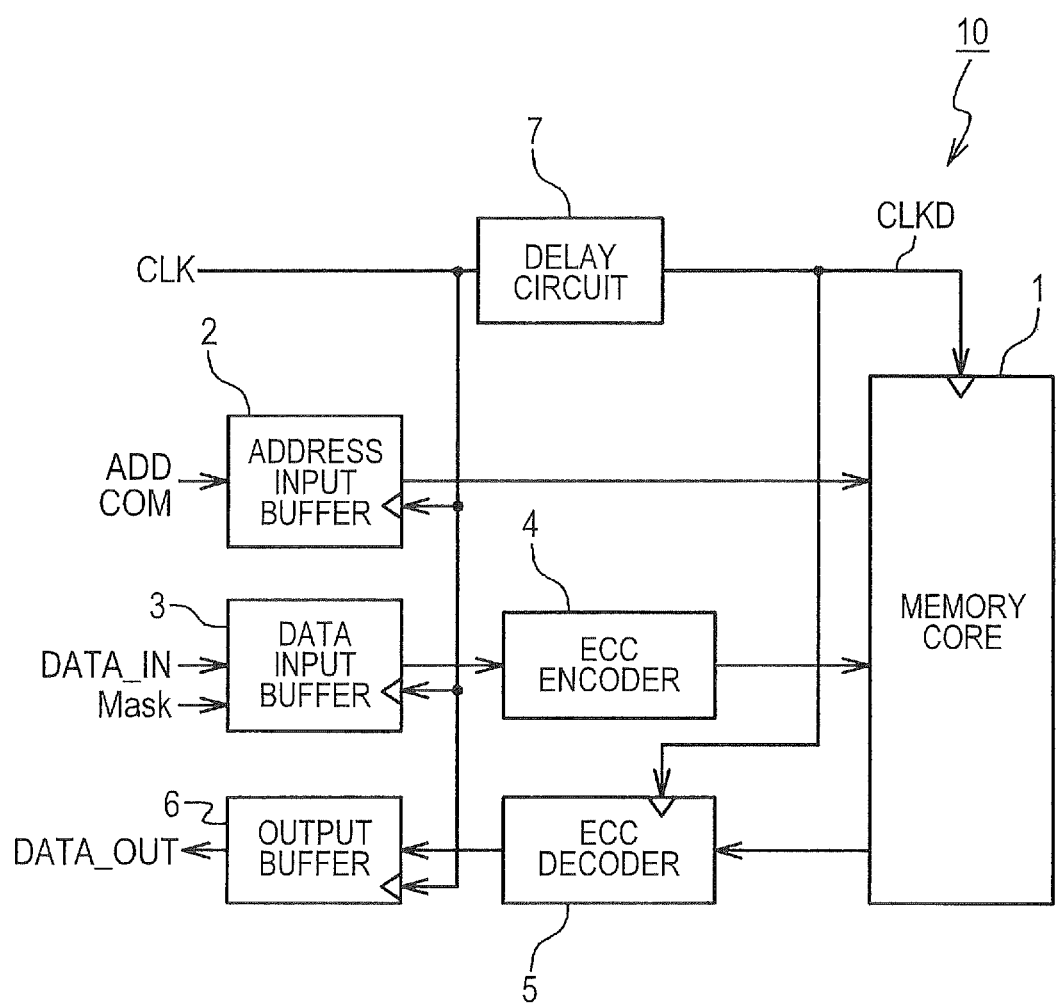
FIG. 3 is a block diagram presenting a configuration of a semiconductor storage circuit of a first embodiment of the present invention.

FIG. 3 is a block diagram presenting a configuration of a semiconductor storage circuit of a first embodiment of the present invention. In the first embodiment, the semiconductor storage circuit of the present invention is configured as a RAM macro 10. The RAM macro 10 includes a memory core 1, an address input buffer 2, a data input buffer 3, an ECC encoder 4, an ECC decoder 5, an output buffer 7, and a delay circuit 7.

The memory core 1 includes a cell array in which memory cells are arranged in a matrix and data is stored in the cell array. In the memory core 1, diverse memory cells which are randomly accessible can be used; for example, dynamic random access memory (DRAM) cells, static random access memory (SRAM) cells, etc. can be used as the memory cells in the memory core 1. The address input buffer 2 transfers an address ADD and a command COM which have been input from outside the RAM macro 10 to the memory core 1. The data input buffer 3 transfers input data DATA_IN which has been input from outside the RAM macro 10 to the ECC encoder 4. A data mask signal Mask is supplied to the data input buffer 3 and the data input buffer 3 has a function of masking partial bits of input data DATA_IN.

The ECC encoder 4 performs ECC encoding of input data DATA-IN and thus generates ECC data. The ECC data is data that is used to detect and correct an error in data stored in the memory core 1. The ECC encoder 4 transfers input data DATA_IN and ECC data to the memory core 1 as write data. Write data transferred to the memory core 1 is stored into the memory core 1.

ECC decoder 5 performs ECC decoding of read data which has been read from the memory core 1 and thus generates output data DATA_OUT. Particularly, both actual data (i.e., data corresponding to input data) and ECC data are included in read data which has been read from the memory core 1. Using the ECC data, the ECC decoder 5 detects whether there is an error in the read data which has been read from the memory core 1. If no error has been detected, the ECC decoder 5 outputs the actual data included in the read data as output data DATA_OUT. If an error has been detected and it is correctable, the ECC decoder 5 corrects the error in the read data and sends the thus corrected data to the output buffer 6 as output data DATA_OUT. The output buffer 6 outputs the output data DATA_OUT outside.

The RAM macro 10 is externally supplied with a clock signal CLK and the memory core 1, address input buffer 2, data input buffer 3, ECC decoder 5, and output buffer 6 operate in response to the clock signal CLK. The clock signal CLK has a cycle that is as long as an operation cycle. One cycle of the clock signal CLK corresponds to an operation cycle.

However, the memory core 1 and the ECC decoder 5 are supplied with a delayed clock signal CLKD that is obtained by delaying the clock signal CLK by the delay circuit 7. This is intended to delay activation timing of the memory core 1 and delay operation timing of the ECC decoder 5 in tune with the activation timing of the memory core 1. As will be detailed later, it is important for the RAM macro 10 of the present embodiment to delay the activation timing of the memory core 1 and delay the operation timing of the ECC decoder 5 in order to maintain a high operating frequency and enhance random accessibility.

Figure 4:
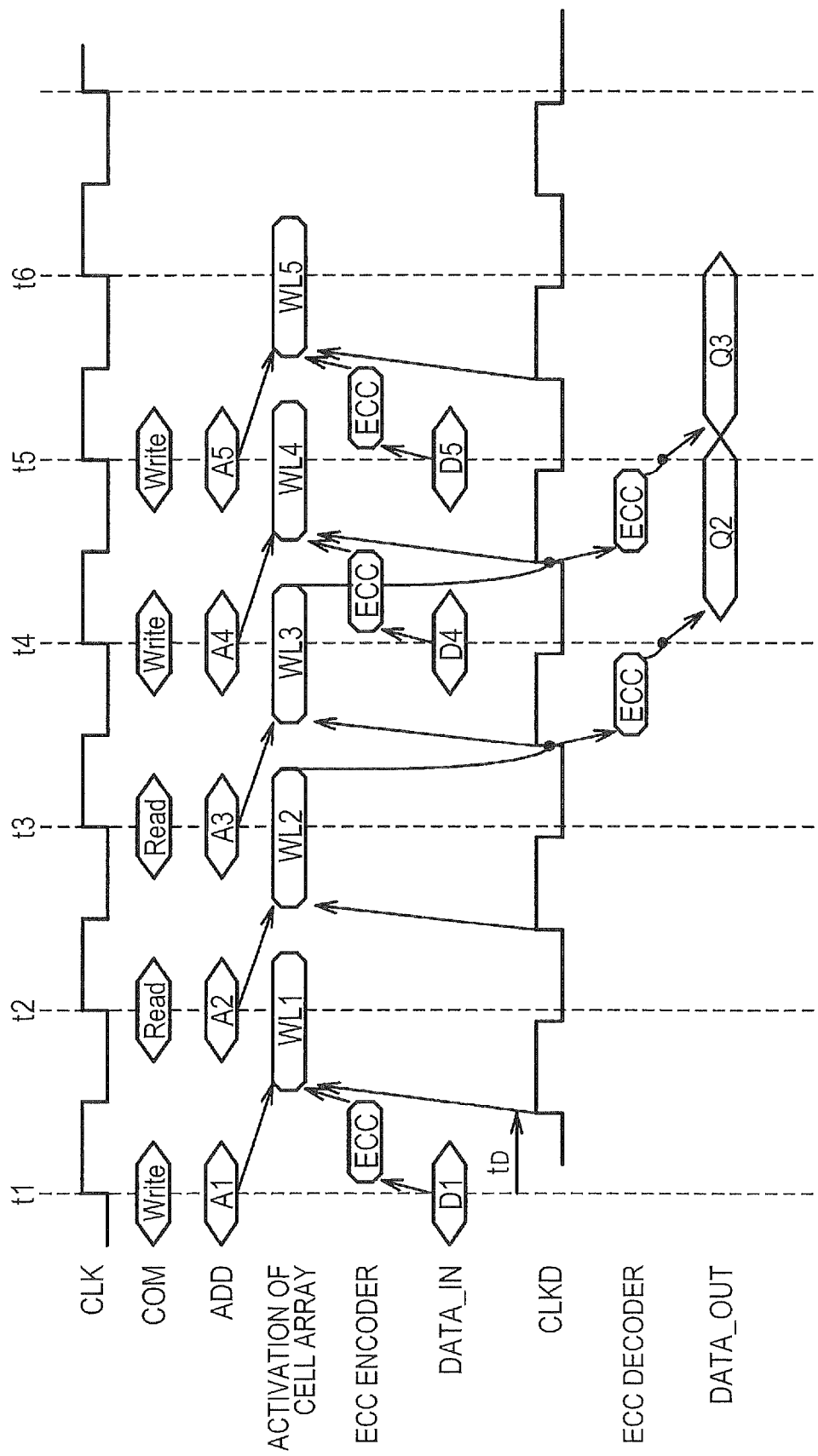
FIG. 4 is a timing chart illustrating an operation sequence of the semiconductor storage circuit of the first embodiment.

FIG. 4 is a timing chart illustrating an operation sequence of the RAM macro 10 of the first embodiment. A clock signal CLK is delayed by the delay circuit 7 and a delayed clock signal CLKD is generated. In the example of FIG. 4, a delay time of the delayed clock signal CLKD from the clock signal CLK is presented as $t_D$.

For a write operation, at the start of an operation cycle in which the write operation is to be performed, a write command is input as a command COM in sync with an assertion of a clock signal CLK (a rising edge of the clock signal CLK in the present embodiment). Together with the input of the write command, an address ADD specifying a write address and input data DATA_IN are input at the same time. The address input buffer 2 and the data input buffer 3 take in the address ADD and the input data DATA_IN synchronously with the assertion of the clock signal CLK. Then, ECC encoding is performed by the ECC encoder 4 and ECC data is generated. Furthermore, the memory core 1 is activated (that is, a selected word line corresponding to the write address is activated) in response to an assertion of a delayed clock signal CLKD (a rising edge of the delayed clock signal CLKD in the present embodiment) and writing of write data (i.e., the input data DATA_IN and the ECC data) into the memory core 1 is performed.

The delay time $t_D$ of the delayed clock signal CLKD is adjusted so that activation timing of the memory core 1 will follow the completion of the ECC encoding and data will be fixed in a memory cell addressed by the write address in the memory core 1 at the start of a next operation cycle. It should be noted that the number of write cycles is 1, because data is fixed in the memory cell addressed by the write address in the memory core 1 at the start of a next operation cycle.

For example, at a time instant t1 to start an operation cycle, when a write command, an address A1 and input data D1 are input, ECC encoding of the input data D1 is performed and ECC data is generated. Then, the memory core 1 is activated in response to the assertion of the delayed clock signal CLKD. At this time, in the memory core 1, a word line WL1 selected by the address A1 is activated and the write data is written into a memory cell addressed by the address A1.

A write operation is performed in the same way also for a time instant t4 when a write command, an address A4, and input data D4 are input and a time instant t5 when a write command, an address A5, and input data D5 are input.

It should here be noted that a write operation is exactly completed after entering an operation cycle following the operation cycle in which the write operation has begun. However, because activation timing of the memory core 1 is delayed also in a next operation cycle, as will be described later, delayed completion of a write operation poses no problem.

On the other hand, for a read operation, at the start of an operation cycle in which a read operation is to begin, a read command is input as a command COM in sync with an assertion of the clock signal CLK and, besides, an address ADD specifying a read address is input. Then, the memory core 1 is activated (that is, a selected word line corresponding to the read address is activated) in response to an assertion of the delayed clock signal CLKD and data to be read is read from a memory cell addressed by the address ADD in the memory core 1.

Then, the read data which has been read from the memory core 1 is taken into the ECC decoder 5 in response to an assertion of the delayed clock signal CLKD in a next operation cycle and ECC decoding is performed by the ECC decoder 5. Output data DATA_OUT obtained through the ECC decoding is sent to the output buffer 6. The output buffer 6 takes in the output data DATA_OUT from the ECC decoder 5 at the start of an operation cycle that is two cycles after the operation cycle in which the read operation has begun and outputs the taken output data DATA_OUT outside. It should be noted that the number of read cycles is 2 in this way of read operation.

For example, suppose that, at a time instant t2 to start an operation cycle, a read command and an address A2 have been input. Then, the memory core 1 is activated (that is, a word line corresponding to the address A2 is activated) in response to an assertion of the delayed clock signal CLKD and data to be read in a location addressed by the address A2 is read from the memory core 1. Furthermore, the read data which has been read from the memory core 1 is taken into the ECC decoder 5 in response to an assertion of the delayed clock signal CLKD in a next operation cycle (starting at a time instant t3) and ECC decoding is performed by the ECC decoder 5. Output data Q2 obtained through the ECC decoding is sent to the output buffer 6. The output data Q2 sent to the output buffer 6 is taken into the output buffer 6 at the start of a next operation cycle (starting at a time instant t4) and output outside.

A read operation is performed in the same way also for a time instant t3 when a read command and an address A3 are input.

It should here be noted that a read operation is exactly completed after entering an operation cycle that is two cycles after the operation cycle in which the read operation has begun. However, because activation timing of the memory core 1 is delayed in each operation cycle, as will be described later, delayed completion of a read operation poses no problem.

In the operation sequence of the RAM macro 10 of the present embodiment described above, when a write operation is performed, the memory core 1 is activated in synch with the delayed clock signal CLKD. Accordingly, data writing into a memory cell addressed by a write address can begin in the same operation cycle as the operation cycle in which ECC encoding is performed. As a result, the number of write cycles can decrease to 1, though internal operation of the memory core 1 for a write operation terminates after entering an operation cycle following the operation cycle beginning with the input of a write command.

Besides, in an operation cycle following the cycle in which a read operation has begun, ECC decoding begins in sync with the delayed clock signal CLKD. Accordingly, read data can be output at the start of a next operation cycle without a decrease in the operating frequency. In other words, a high operating frequency can be maintained. Moreover, in this way of operation, the number of read cycles remains at 2, though internal operation of the memory core 1 for a read operation terminates after entering an operation cycle that is two cycles after the operation cycle beginning with the input of a read command.

In addition, in the operation sequence of the RAM macro 10 of the present embodiment, the memory core 1 is activated in synch with the delayed clock signal CLKD for both a read operation and a write operation. Thereby, a delay time after the input of each write command until the activation timing of the memory core 1 (that is, the activation timing of a selected word line) and a delay time after the input of each read command until the activation timing of the memory core 1 are equalized.

In this way of operation, random accessibility is enhanced. As will be understood from FIG. 4, even if a read command is input at the start of an operation cycle following an operation cycle beginning with the input of a write command, there occurs no collision between the activation of the memory core 1 for the write operation and that for the read operation. Likewise, even if a write command is input at the start of an operation cycle following an operation cycle beginning with the input of a read command, there occurs no collision between the activation of the memory core 1 for the write operation and that for the read operation.

Second Embodiment

Figure 5:
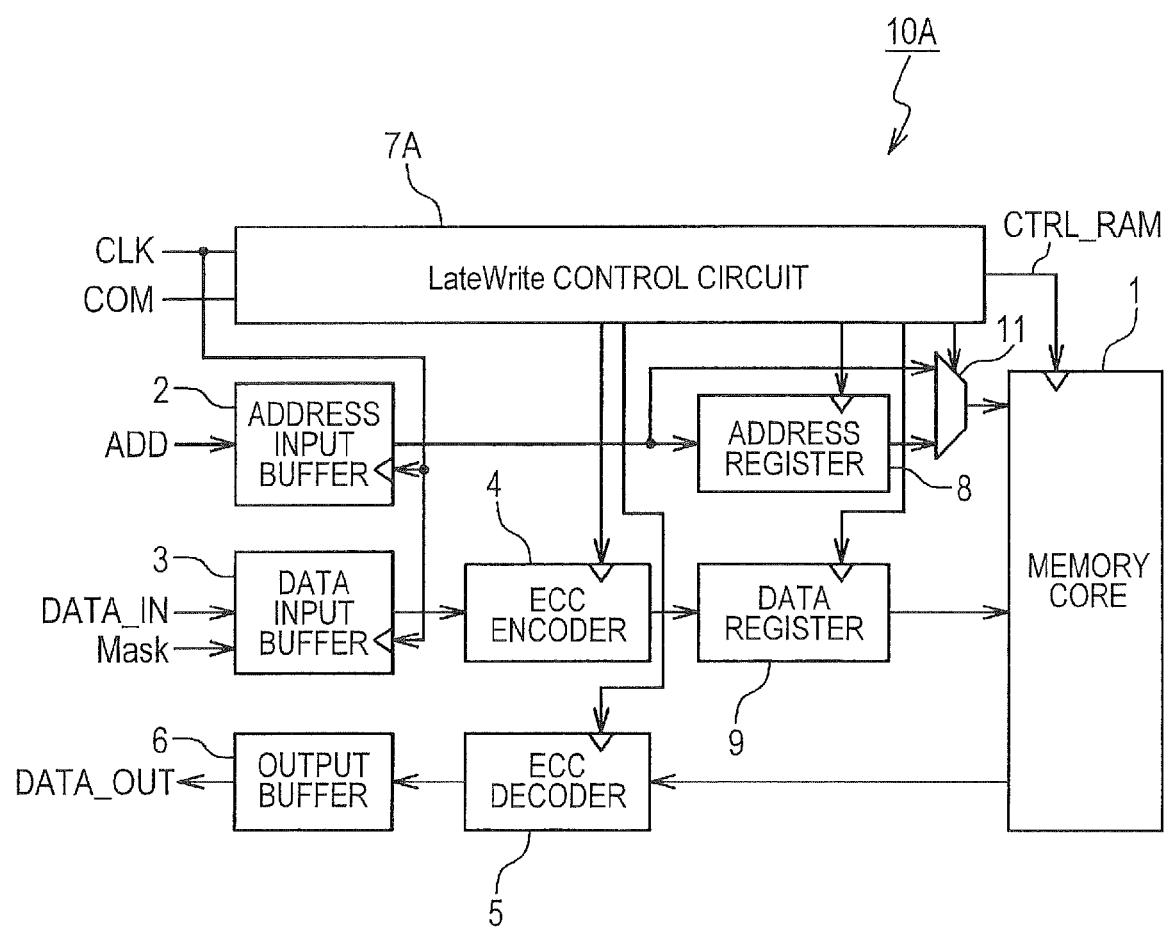
FIG. 5 is a block diagram presenting a configuration of a semiconductor storage circuit of a second embodiment of the present invention.

FIG. 5 is a block diagram presenting a configuration of a semiconductor storage circuit of a second embodiment of the present invention. The semiconductor storage circuit of the second embodiment is configured as a RAM macro 10A that performs a late write mode of write operation. The late write mode is a mode in which a write address and data which have been input together with the input of a write command are stored in a register and the stored data is written into a memory cell addressed by the write address in an operation cycle beginning with the input of a next write command. The configuration and operation of the RAM macro 10A of the second embodiment are described below.

While the RAM macro 10A of the second embodiment has a configuration analogous to that of the RAM macro 10 of the first embodiment, its difference from the latter lies in that it additionally includes an address register 8, a data register 9, and a selector 11 and includes a late write control circuit 7A instead of the delay circuit 7. The address register 8 has a function of temporarily storing an address ADD and the data register 9 has a function of receiving write data (input data DATA_IN and ECC data) from the ECC encoder 4 and temporarily storing the write data. The selector 11 sends an address which is output from the address input buffer 2 to the memory core 1 when a read operation is performed and sends an address which is output from the address register 8 to the memory core 1 when a write operation is performed. As will be described later, the address register 8, the data register 9, and the selector 11 are used to implement a late write mode of write operation.

The late write control circuit 7A controls respective circuits (memory core 1, address input buffer 2, data input buffer 3, ECC encoder 4, ECC decoder 5, address register 8, data register 9, and selector 11) of the RAM macro 10A in synch with a clock signal CLK which is externally supplied. A command COM is input to the late write control circuit 7A and the late write control circuit 7A carries out control on a variety of tasks according to the command COM. In FIG. 5, a symbol CTRL_RAM stands for a control signal for controlling the memory core 1. To other circuits as well, a control signal for controlling their operation is supplied. A data mask signal Mask is supplied to the data input buffer 3 and the data input buffer 3 has a function of masking partial bits of input data DATA_IN.

Figure 6:
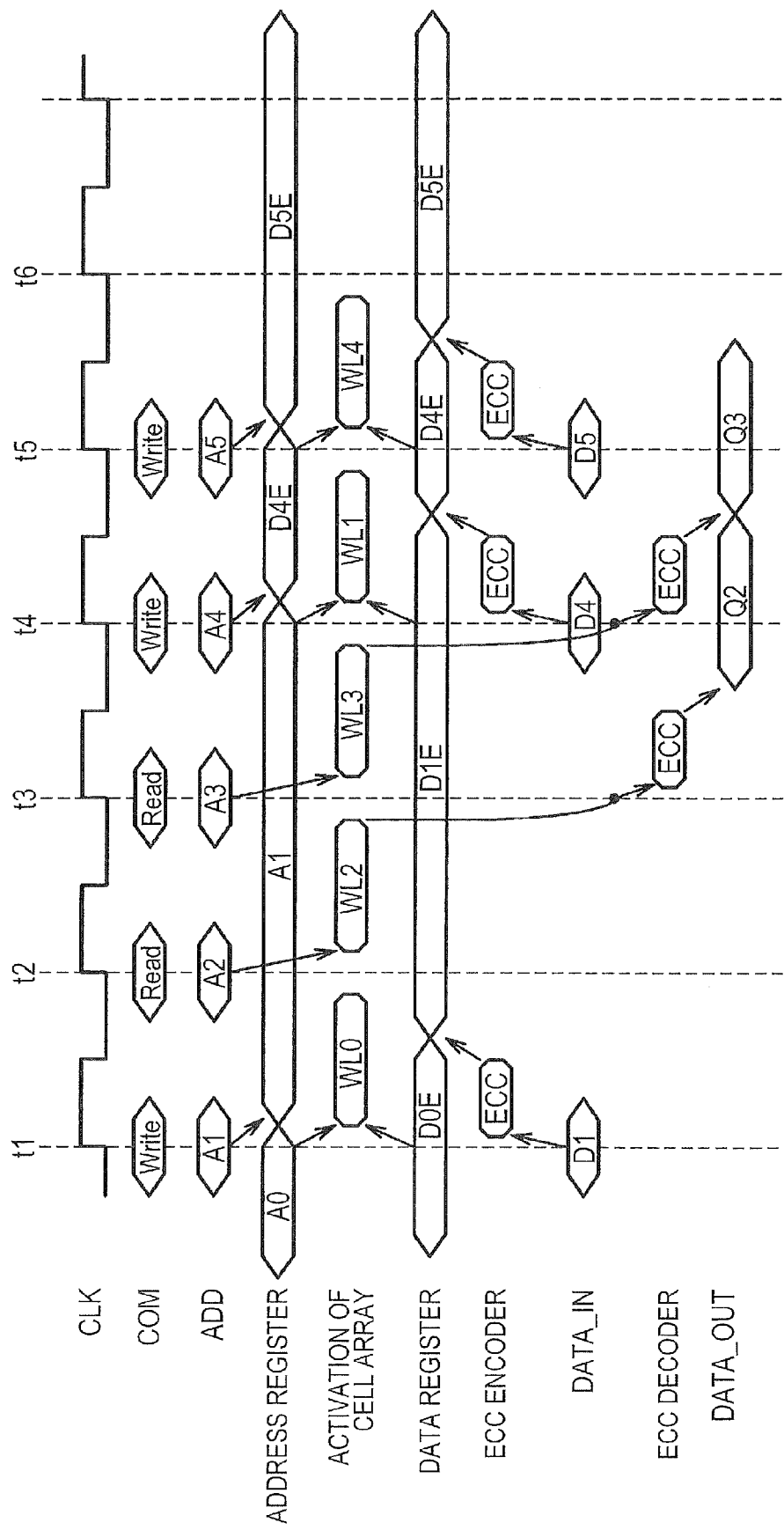
FIG. 6 is a timing chart illustrating an operation sequence of the semiconductor storage circuit of the second embodiment.

FIG. 6 is a timing chart illustrating an operation sequence of the RAM macro 10A of the second embodiment. At the start of an operation cycle in which a write operation is to begin, a write command is input as a command COM in sync with an assertion of the clock signal CLK. Together with the input of the write command, an address ADD specifying a write address and input data DATA_IN are input at the same time. The address input buffer 2 and the data input buffer 3 take in the address ADD and the input data DATA_IN synchronously with the assertion of the clock signal CLK.

Furthermore, the memory core 1 is activated (that is, a selected word line is activated) in response to an assertion of a delayed clock signal CLKD and writing of write data into the memory core 1 is performed. At this point, for this write operation, the output of the address register 8 is selected by the selector 11. Thus, an address that is selected when the memory core 1 has been activated is an address stored in the address register 8, that is, a write address which was input together with a preceding write command. The write data to be written is write data stored in the data register 9, that is, input data DATA_IN which was input together with the preceding write command and ECC data generated from the input data DATA_IN by ECC encoding. In this way of operation, the late write mode of write operation is implemented.

In parallel with the writing of the write data and ECC data stored in the data register 9 into the memory core 1, updating the address register 8 and the data register 9 is performed. An address ADD which was input together with the input of the latest write command is stored into the address register 8. Besides, ECC encoding of input data DATA_IN which was input together with the input of the latest write command is performed by the ECC encoder 4 and ECC data is generated. The input data DATA_IN and the generated ECC data are sent from the ECC encoder 4 to the data register 9 and stored as write data. The write data stored in the data register 9 is sent to and written into the memory core when a next write command is input.

For example, suppose that, before a time instant t1, an address A0 was being stored in the address register 8 and write data D0E was being stored in the data register 9. At the time instant t1 to start an operation cycle, when a write command, an address A1, and input data D1 are input, the memory core 1 is activated in response to the input of the write command. At this time, a word line corresponding to the address A0 being stored in the address register 8 is selected and the write data D0E being stored in the data register 9 is written into a memory cell addressed by the address A0.

Concurrently, ECC encoding of the input data D1 is performed and ECC data is generated, and the input data D1 and the generated ECC data are stored into the data register 9 as write data D1E. In addition, the address A1 is stored into the address register 8.

Then, at a time instant t4, when a write command, an address A4, and input data D4 are input, the memory core 1 is activated in response to the input of the write command. At this time, a word line corresponding to the address A1 being stored in the address register 8 is selected and the write data D1E being stored in the data register 9 is written into a memory cell addressed by the address A1.

Concurrently, ECC encoding of the input data D4 is performed and ECC data is generated, and the input data D4 and the generated ECC data are stored into the data register 9 as write data D4E. At a time instant t5, when a write command is input, likewise, the write data D4E being stored in the data register 9 is written into a memory cell addressed by the address A4 being stored in the address register 8. A write operation is likewise performed for input data D5 and an address A5 which are input together with a write command at the time instant t5.

On the other hand, for a read operation, at the start of an operation cycle in which a read operation is to begin, a read command is input as a command COM in sync with an assertion of the clock signal CLK and, besides, an address ADD specifying a read address is input. Then, the memory core 1 is activated (that is, a selected word line corresponding to the read address is activated) in response to an assertion of the clock signal CLK and data to be read is read from the memory core 1. Actual data and ECC data are included in the thus read data.

Then, the read data which has been read from the memory core 1 is taken into the ECC decoder 5 in response to an assertion of the clock signal CLK at the start of a next operation cycle and ECC decoding is performed by the ECC decoder 5. Output data DATA_OUT obtained through the ECC decoding is sent to the output buffer 6. The output buffer 6 outputs the output data DATA_OUT received from the ECC decoder 5 outside. The read operation is already completed at the start of an operation cycle that is two cycles after the operation cycle beginning with the input of the read command. It should be noted that the number of read cycles is 2 in this way of read operation.

For example, suppose that, at a time instant t2 to start an operation cycle, a read command and an address A2 have been input. The memory core 1 is activated (that is, a word line corresponding to the address A2 is activated) in response to the input of the read command and data to be read in a location addressed by the address A2 is read from the memory core 1. Furthermore, the read data which has been read from the memory core 1 is taken into the ECC decoder 5 in response to an assertion of the clock signal CLK at the start of a next operation cycle (starting at a time instant t3) and ECC decoding is performed by the ECC decoder 5. Output data Q2 obtained through the ECC decoding is sent to the output buffer 6. The output data Q2 is output outside from the output buffer 6.

A read operation is performed in the same way also for a time instant t3 when a read command and an address A3 are input.

In the operation sequence of the RAM macro 10A of the present embodiment described above, the late write mode of write operation is used. Thus, input data DATA_IN which has been input together with a write command is actually written into the memory core 1 in an operation cycle beginning with a next write command. Accordingly, it is possible to secure time required for ECC encoding without delaying activation timing of the memory core 1 using a delayed clock signal CLKD, as in the first embodiment. Meanwhile, because a write operation can be completed in an operation cycle beginning with the input of a write command, the number of write cycles in effect can decrease to 1.

Besides, at the start of an operation cycle following the cycle in which a read operation has begun, ECC decoding begins in sync with the clock signal CLK. Accordingly, output data DATA_OUT can be output at the start of a next operation cycle without a decrease in the operating frequency. In other words, a high operating frequency can be maintained. Moreover, in this way of operation, the number of read cycles remains at 2.

In addition, in the operation sequence of the RAM macro 10A of the present embodiment, the memory core 1 is activated in response to an assertion of the clock signal CLK at the start of an operation cycle for both a read operation and a write operation. Thereby, a delay time after the input of each write command until the activation timing of the memory core 1 (that is, the activation timing of a selected word line) and a delay time after the input of each read command until the activation timing of the memory core 1 are equalized.

In this way of operation, random accessibility is enhanced. As will be understood from FIG. 6, even if a read command is input at the start of an operation cycle following an operation cycle beginning with the input of a write command, there occurs no collision between the activation of the memory core 1 for the write operation and that for the read operation. Likewise, even if a write command is input at the start of an operation cycle following an operation cycle beginning with the input of a read command, there occurs no collision between the activation of the memory core 1 for the write operation and that for the read operation.

Third Embodiment

Figure 7:
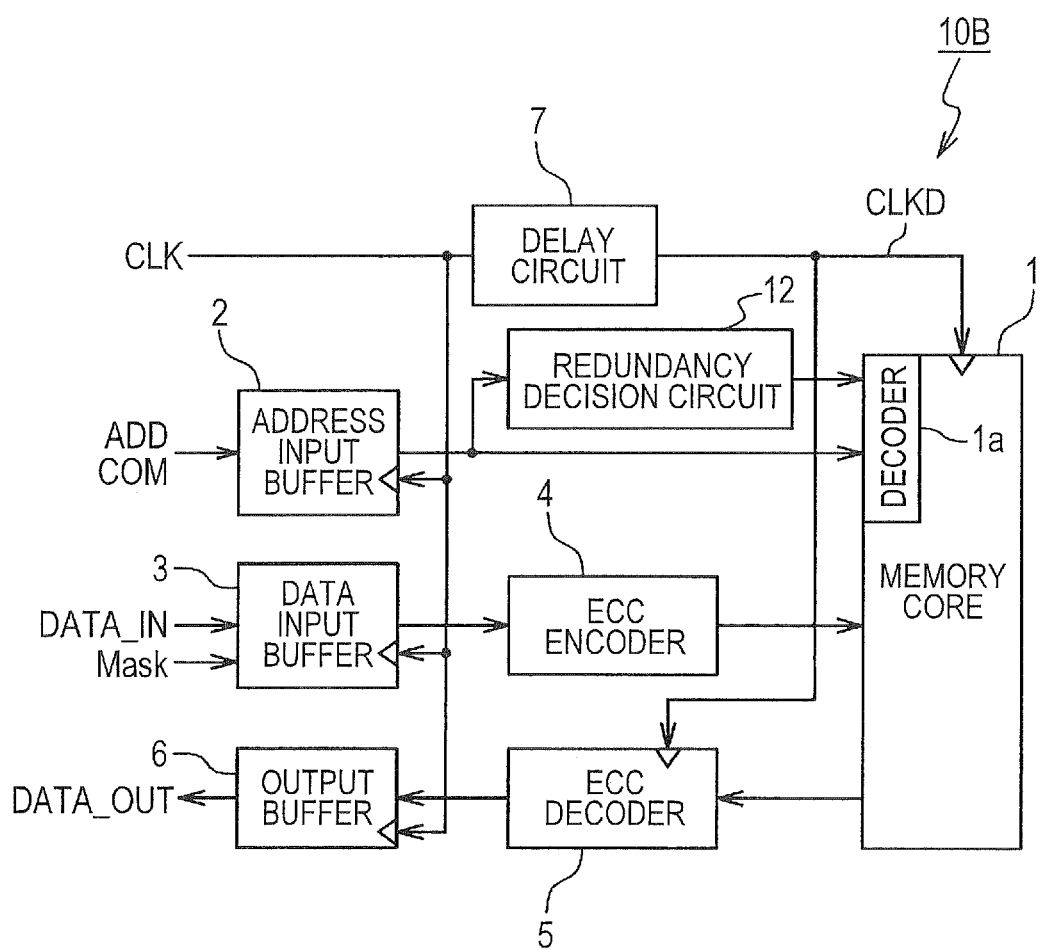
FIG. 7 is a block diagram presenting a configuration of a semiconductor storage circuit of a third embodiment of the present invention.

FIG. 7 is a block diagram presenting a configuration of a semiconductor storage circuit of a third embodiment of the present invention. The semiconductor storage circuit of the third embodiment is configured as a RAM macro 10B having a configuration adapted to enhance reliability by using a memory redundancy technique. Particularly, while the RAM macro 10B of the third embodiment has a configuration analogous to that of the RAM macro 10 of the first embodiment, its difference from the latter lies in that it includes a redundancy decision circuit 12. Moreover, the memory core 1 is provided with redundant memory cells.

The redundancy decision circuit 12 receives an address ADD (a write address or a read address) from the address input buffer 2, performs a redundancy decision process which decides whether redundancy is needed for the address ADD received, and generates a redundancy decision signal. Particularly, if a memory cell selected by the received address ADD is faulty, the redundancy decision circuit 12 sends to the memory core 1, a redundancy decision signal that instructs to select a redundant memory cell instead of the faulty memory cell. A decoder 1a of the memory core 1 selects a redundant memory cell instead of the faulty memory cell in response to the address ADD received from the address input buffer 2 and the redundancy decision signal. For example, it may select a redundant word line linked to a redundant memory cell instead of a word line to which the fault memory cell is coupled and it may select a redundant bit line linked to a redundant memory cell instead of a bit line to which the fault memory cell is coupled. It should here be noted that the operation of the redundancy decision circuit 12 is performed in parallel with the operation of the ECC encoder 4.

In the first embodiment, because of delayed activation timing of the memory core 1, a critical path that determines an operating speed is a path transmitting input data DATA_IN or output data DATA_OUT, not a path transmitting an address ADD. Meanwhile, in the third embodiment which makes effective use of this fact, signal processing by the redundancy decision circuit 12 and the decoder 1a (i.e., the redundancy decision process and changing a word line and/or bit line in the memory core 1), which is regarded as a factor of decreasing the operating speed and increasing the area, is performed in parallel with ECC encoding by the ECC encoder 4. Thereby, a circuit configuration or layout making it possible to reduce the area and power consumption can be selected.

Fourth Embodiment

Figure 8:
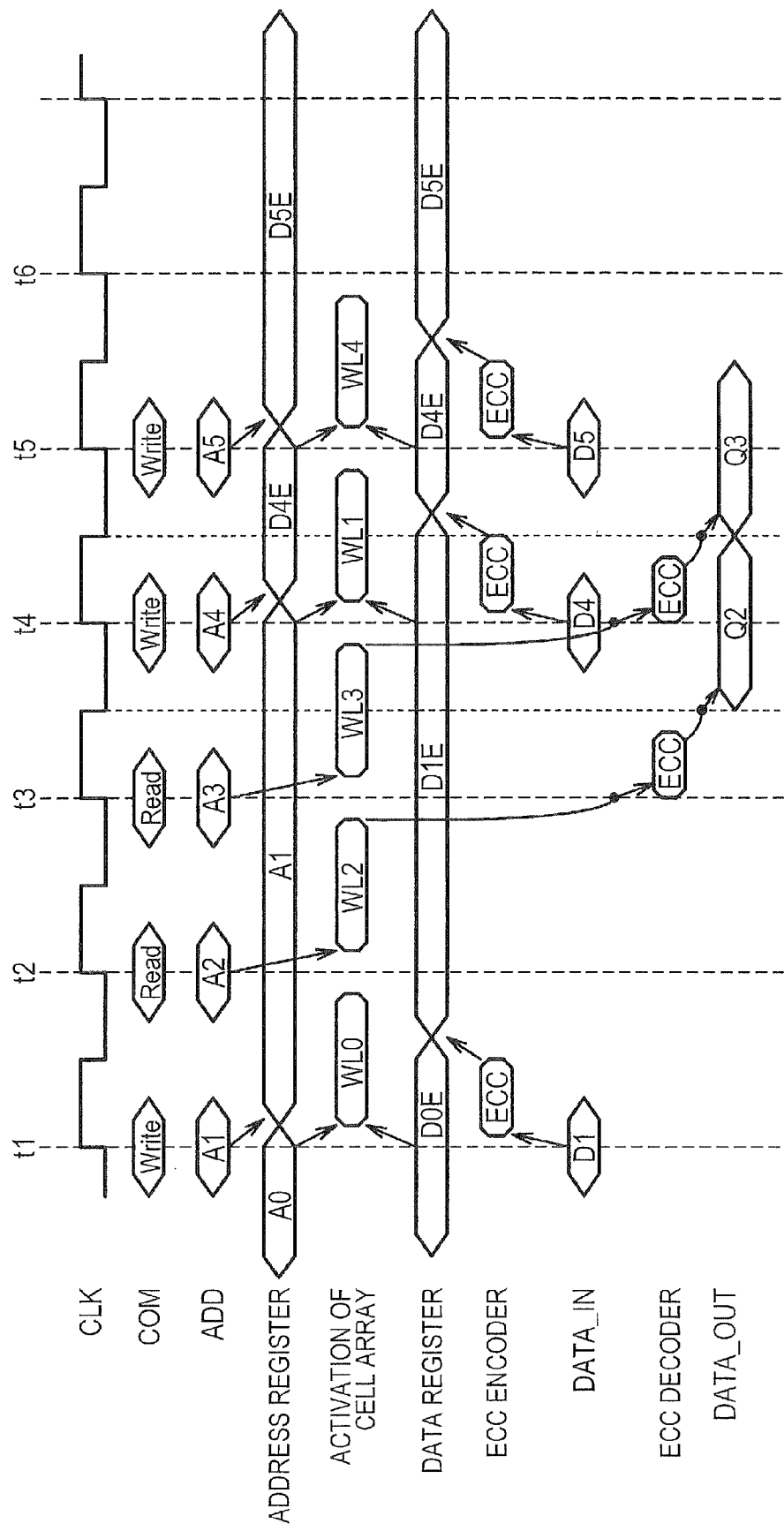
FIG. 8 is a timing chart illustrating an operation sequence of a semiconductor storage circuit of a fourth embodiment of the present invention.

FIG. 8 is a timing chart illustrating an operation sequence of a semiconductor storage circuit of a fourth embodiment of the present invention. In the fourth embodiment, a RAM macro having the same configuration as the RAM macro 10A of the second embodiment is used. However, in the fourth embodiment, for a read operation, the operation of the RAM macro is modified such that output data DATA_OUT is output in response to a negation of the clock signal CLK (a falling edge of the clock signal CLK in the present embodiment). Thereby, the number of read cycles is reduced to 1.5. A write operation of the RAM macro of the fourth embodiment is the same as is the case for the second embodiment.

Particularly, at the start of an operation cycle in which a read operation is to begin, a read command is input as a command COM in sync with an assertion of the clock signal CLK and, besides, an address ADD specifying a read address is input. Then, the memory core 1 is activated (that is, a selected word line corresponding to the read address is activated) in response to an assertion of the clock signal CLK and data to be read is read from the memory core 1.

Then, the read data which has been read from the memory core 1 is taken into the ECC decoder 5 in response to an assertion of the clock signal CLK at the start of a next operation cycle and ECC decoding is performed by the ECC decoder 5. Output data DATA_OUT obtained through the ECC decoding is sent to the output buffer 6.

In response to a negation of the clock signal CLK, the output buffer 6 receives the output data DATA_OUT from the ECC decoder 5 and outputs the received output data DATA_OUT outside. A read operation is to be completed at the middle of an operation cycle following the operation cycle beginning with the input of a read command. In this way of read operation, it is possible to reduce the number of read cycles to 1.5.

Fifth Embodiment

Figure 9:
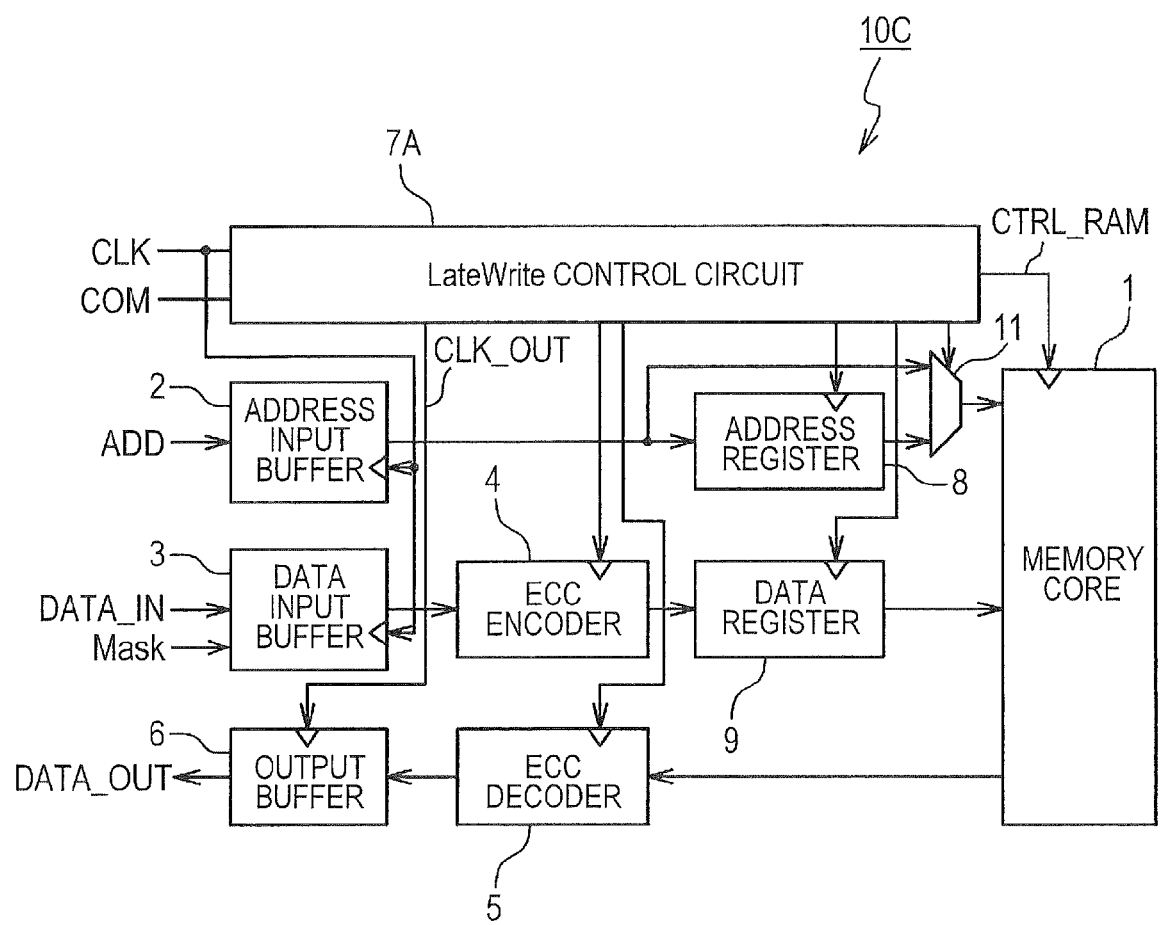
FIG. 9 is a block diagram presenting a configuration of a semiconductor storage circuit of a fifth embodiment of the present invention.

FIG. 9 is a block diagram presenting a configuration of a semiconductor storage circuit of a fifth embodiment of the present invention. The semiconductor storage circuit of the fifth embodiment is configured as a RAM macro 10C that performs a late write mode of write operation, like the RAM macro 10A of the second embodiment. However, in the RAM macro 100 of the fifth embodiment, an output clock signal CLK_OUT which is used only for output is supplied to the output buffer 6. In the configuration of the RAM macro 10A of the second embodiment, timing when output data DATA_OUT is generated is affected by a delay in the ECC decoder 5. Consequently, data release timing varies depending on the contents of read data, which may give rise to a problem. In order to cope with such a problem, in the fifth embodiment, the output clock signal CLK_OUT which is obtained by delaying the clock signal CLK is supplied from the late write control circuit 7A to the output buffer 6 and the output buffer 6 outputs output data DATA_OUT in sync with the output clock signal CLK_OUT. Thereby, data release timing in each operation cycle become constant.

Figure 10:
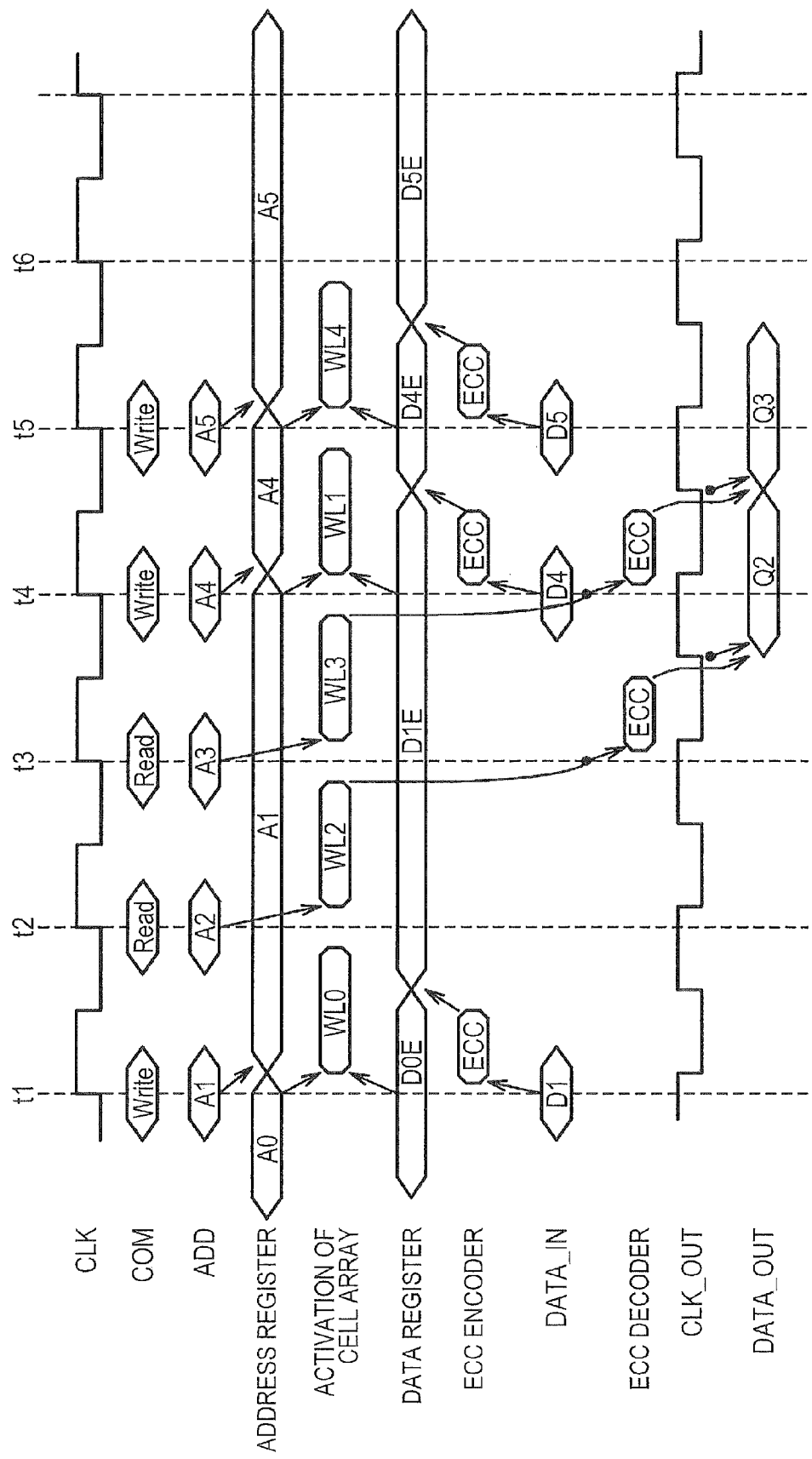
FIG. 10 is a timing chart illustrating an operation sequence of the semiconductor storage circuit of the fifth embodiment.

FIG. 10 is a timing chart illustrating an operation sequence of the RAM macro 10C of the fifth embodiment. A write operation of the RAM macro 10C of the fifth embodiment is the same as is the case for the second embodiment.

On the other hand, a read operation is performed as follows. At the start of an operation cycle in which a read operation is to begin, a read command is input as a command COM in sync with an assertion of the clock signal CLK and, besides, an address ADD specifying a read address is input. Then, the memory core 1 is activated (that is, a selected word line corresponding to the read address is activated) in response to an assertion of the clock signal CLK and data to be read and ECC data are read from the memory core 1.

Then, the read data which has been read from the memory core 1 is taken into the ECC decoder 5 in response to an assertion of the clock signal CLK at the start of a next operation cycle and ECC decoding is performed by the ECC decoder 5. Output data DATA_OUT obtained through the ECC decoding is sent to the output buffer 6.

In response to an assertion of the output clock signal CLK_OUT, the output buffer 6 receives the output data DATA_OUT from the ECC decoder 5 and outputs the received output data DATA_OUT outside. In this way of read operation, while the number of read cycles remains at 2, data release timing in each operation cycle can be made constant.

Besides, in the fifth embodiment, if the output clock signal CLK_OUT is generated by delaying the clock signal CLK by a half cycle, it is also possible to reduce the number of read cycles to 1.5, as is the case for the fourth embodiment.

Sixth Embodiment

Figure 11:
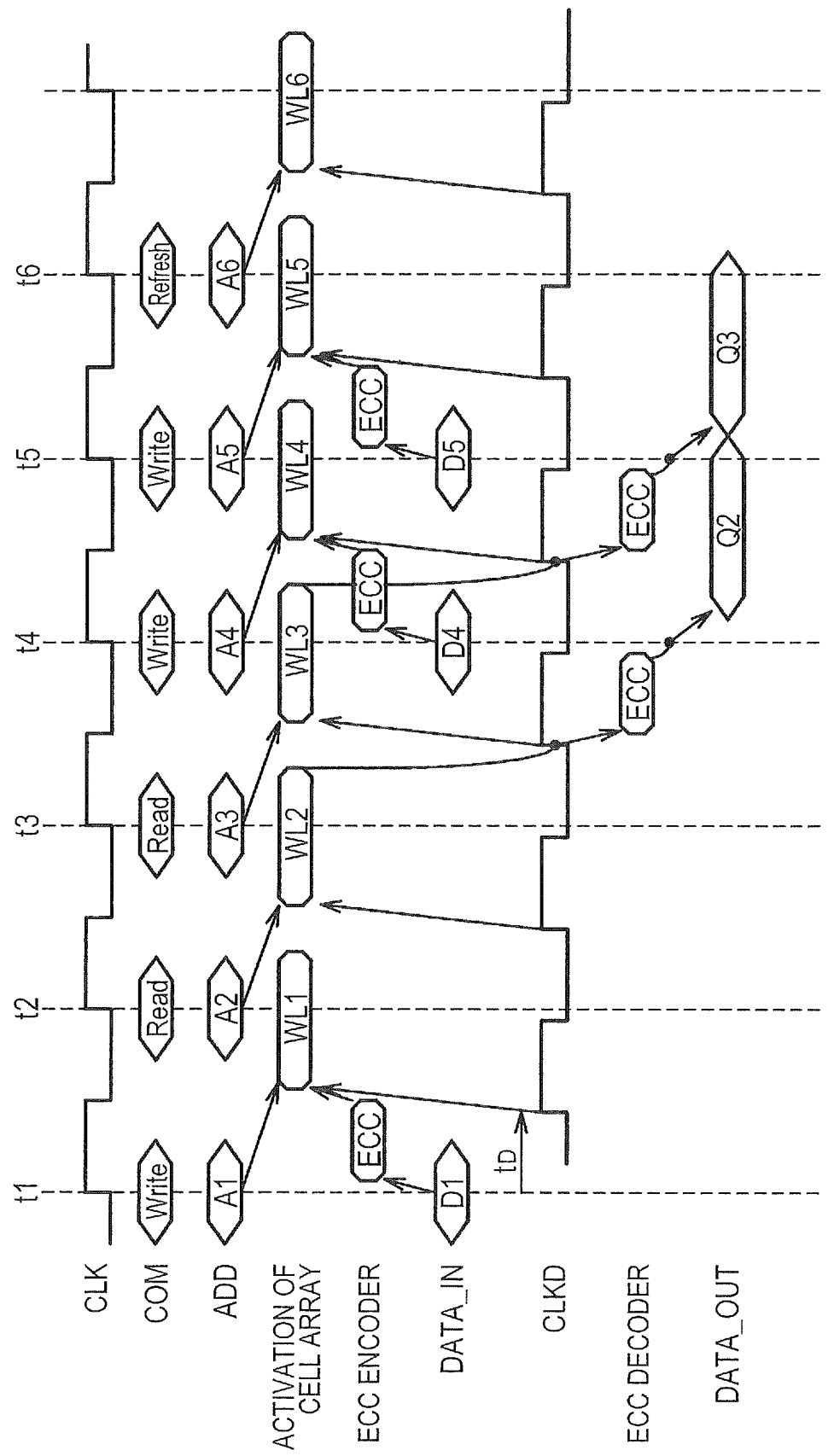
FIG. 11 is a timing chart illustrating one example of an operation sequence of a semiconductor storage circuit of a sixth embodiment.
Figure 12:
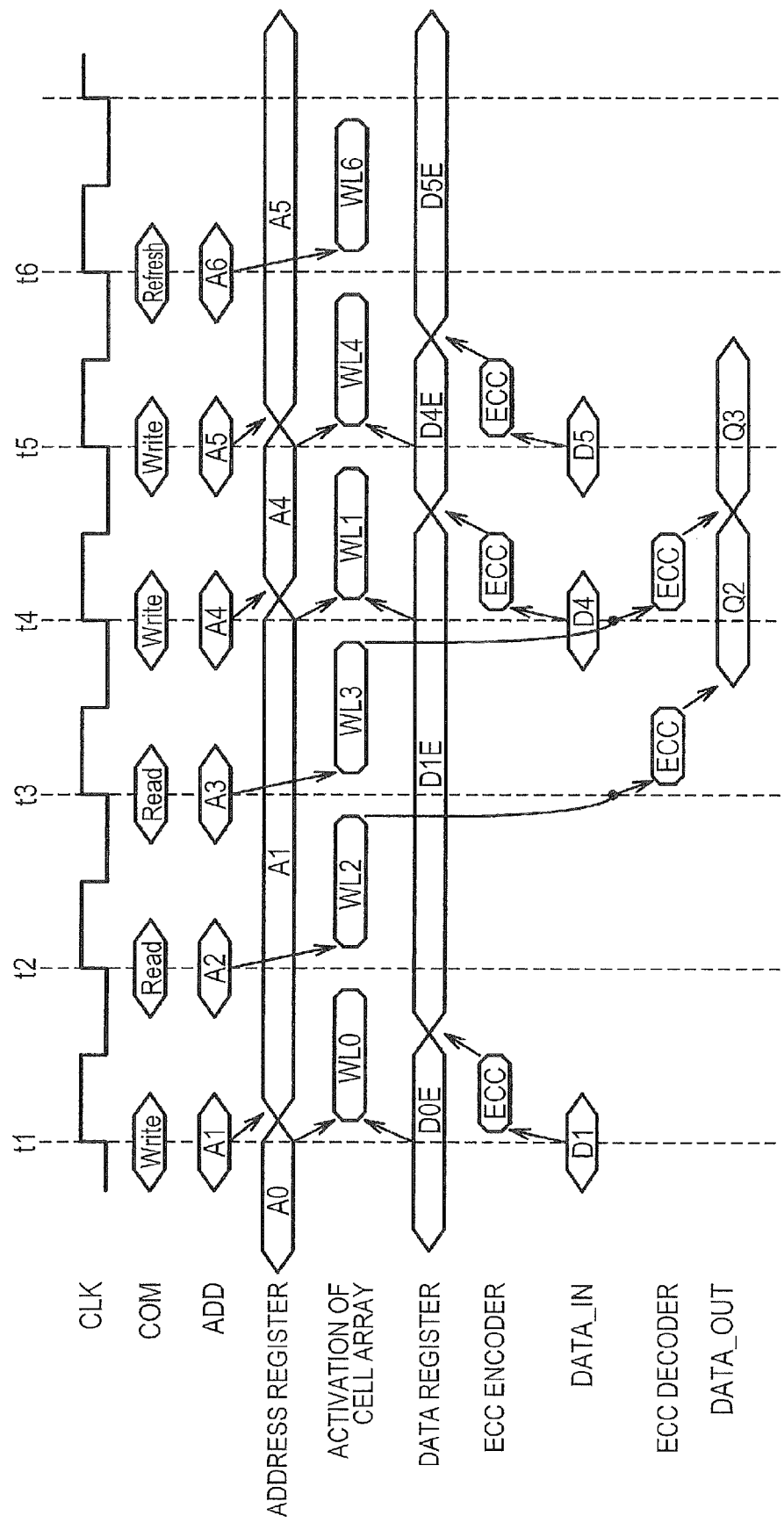
FIG. 12 is a timing chart illustrating another example of an operation sequence of the semiconductor storage circuit of the sixth embodiment.

FIG. 11 and FIG. 12 are timing charts illustrating an operation sequence of a semiconductor storage circuit of a sixth embodiment of the present invention. In the sixth embodiment, operation of a RAM macro is presented in a case where the memory core 1 with integrated memory cells requiring a refresh operation is used. DRAM cells are a typical example of memory cells requiring a refresh operation.

Now, FIG. 11 illustrates an example of modification to the operation sequence of the RAM macro 10 of the first embodiment and illustrates the operation sequence of the RAM macro in a case where a delayed clock signal CLKD is used. Meanwhile, FIG. 12 illustrates an example of modification to the operation sequence of the RAM macro 10A of the second embodiment and illustrates the operation sequence of the RAM macro in a case where a late write mode of write operation is performed. In the operation sequences of FIG. 11 and FIG. 12, in each case, a refresh operation is performed in response to a command (refresh command) that instructs to execute a refresh operation. An address ADD is input together with a refresh command and a memory cell coupled to a selected word line corresponding to the address ADD is refreshed.

In the present embodiment, a delay time after the input of a refresh command until activation timing of the memory core 1 (that is, activation timing of a selected word line) is adjusted to be equal to a delay time after the input of each write command until activation timing of the memory core 1 and a delay time after the input of each read command until activation timing of the memory core 1. Specifically, in the operation sequence of FIG. 11, the memory core 1 is activated in synch with the delayed clock signal CLKD in each case when a read operation, a write operation, or a refresh operation is performed. On the other hand, in the operation sequence of FIG. 12, the memory core 1 is activated in response to an assertion of the clock signal CLK at the start of an operation cycle in each case when a read operation, a write operation, or a refresh operation is performed. Thereby, a delay time after the input of a refresh command until the activation timing of the memory core 1 becomes equal to a delay time after the input of each write command until the activation timing of the memory core 1 (that is, a delay time after the input of each read command until the activation timing of the memory core 1). In this way of operation, it is possible to enhance random accessibility with the inclusion of a refresh operation.

While embodiments of the present invention have been described in various ways hereinbefore, the present invention should not be construed to be limited to the foregoing embodiments. It should be noted that the present invention may be carried out with modifications, which are obvious to those skilled in the art, made to the foregoing embodiments. While various embodiments have been described in the foregoing context, it is possible to combine and implement multiple embodiments as long as there is no technical inconsistency.

What is claimed is:

1. A semiconductor storage circuit comprising:
   a memory core including a plurality of memory cells;
   an error checking and correction (ECC) encoder; and
   an ECC decoder,
   wherein the memory core is activated in response to input of a command for an operation cycle,
   wherein the ECC encoder performs ECC encoding of input data which is input together with a write command and thus generates ECC data, and generates write data including the input data and the ECC data,
   wherein the ECC decoder performs ECC decoding of read data which has been read from the memory core according to a read command, using ECC data included in the read data, and thus generates output data,
   wherein an adjustment is made to equalize a delay from input of the write command until activation of the memory core and a delay from input of the read command until activation of the memory core, and
   wherein the semiconductor storage circuit further comprises one of:
      a delay circuit that makes the adjustment by generating a delayed clock by delaying a clock signal which is supplied from outside the semiconductor storage circuit, and supplying the delayed clock to the memory core, the ECC decoder performing the ECC decoding in sync with the delayed clock and a delay time of the delayed clock being set such that activation of the memory core will follow completion of the ECC encoding; and
      a control circuit that makes the adjustment by generating a control signal for controlling an activation of the memory core, and supplying the control signal to the memory core.

2. The semiconductor storage circuit according to claim 1, wherein the semiconductor storage circuit comprises the delay circuit, and further comprises:
   a data input buffer that receives the input data in sync with the clock signal which is externally supplied and transfers the received input data to the memory core; and
   an address input buffer that, in synch with the clock signal, receives a write address which is input together with the write command and a read address which is input together with the read command and transfers the received write address and the received read address to the memory core, and
   wherein the memory core is activated in sync with the delayed clock.

3. The semiconductor storage circuit according to claim 2, wherein the delayed clock is the clock signal delayed so that write data written into a memory cell will be fixed until the end of a first operation cycle.

4. The semiconductor storage circuit according to claim 2, further comprising:
   a redundancy decision circuit that performs a redundancy decision process which decides whether to access a redundant memory cell included in the memory core, based on the write address,
   wherein the redundancy decision process is performed in parallel with the ECC encoding.

5. The semiconductor storage circuit according to claim 1, wherein the write command comprises a first write command, and
   wherein writing of the write data into the memory core in response to the first write command is performed when the memory core is activated in response to input of a second write command which is input for a second operation cycle following a first operation cycle beginning with the input of the first write command.

6. The semiconductor storage circuit according to claim 5, further comprising:
   a data register; and
   an address register,
   wherein, in the first operation cycle, the write data is stored into the data register and a write address which has been input together with the first write command is stored into the address register, and
   wherein, in the second operation cycle, the write data stored in the data register is written into a memory cell addressed by the write address stored in the address register.

7. The semiconductor storage circuit according to claim 6, wherein the semiconductor storage circuit comprises the control circuit, and further comprises:
   a data input buffer that receives the input data in sync with the a clock signal which is supplied from outside the semiconductor storage circuit and transfers the received input data to the ECC encoder;
   an address input buffer that, in synch with the clock signal, receives the write address and the read address and outputs the received write address and the received read address; and
   a selector that selects the write address stored in the address register in response to the second write command which is input for the second operation cycle or selects the read address which is output from the address input buffer in response to the read command and outputs the selected address to the memory core, and
   wherein the control circuit, in sync with the clock signal, activates the memory core so that writing of write data into the memory core occurs at such timing so as to equalize a delay from input of the first write command until activation of the memory core and a delay from input of the read command until activation of the memory core.

8. The semiconductor storage circuit according to claim 7, wherein the ECC decoding is performed in a third operation cycle following the second operation cycle,
   wherein, in the second operation cycle, the memory core is activated in response to an assertion of the clock signal, and wherein, in the third operation cycle, the output data is taken into an output buffer and output outside the semiconductor storage circuit in response to a negation of the clock signal.

9. The semiconductor storage circuit according to claim 7, further comprising:
an output buffer,
wherein the ECC decoding is performed in a third operation cycle following the second operation cycle,
wherein the control circuit activates the memory core in sync with the clock signal for the second operation cycle,
wherein the control circuit generates an output clock signal by delaying the clock signal, and
wherein the output buffer takes in and outputs the output data outside the semiconductor storage circuit in sync with the output clock signal.

10. The semiconductor storage circuit according to claim 6, wherein the ECC decoding is performed in a third operation cycle following the second operation cycle, and
wherein the output data is output outside the semiconductor storage circuit until the end of the third operation cycle.

11. The semiconductor storage circuit according to claim 1, wherein, when a refresh command is input as the command for a fifth operation cycle of the each operation cycle, a refresh operation is performed with activation of the memory core, and
wherein a delay from input of the refresh command until the activation of the memory core is equal to a delay from input of the write command until activation of the memory core and a delay from input of the read command until activation of the memory core.

12. An operation method of a semiconductor storage circuit including a memory core having a plurality of memory cells, the operation method comprising:
activating the memory core in response to input of a command for each operation cycle;
when a write command is input as the command for a first operation cycle of the each operation cycle, performing error checking and correction (ECC) encoding of input data which has been input for the first operation cycle and thus generating ECC data, and generating write data comprising the input data and the ECC data;
writing the write data into a memory cell addressed by a write address which has been input for the first operation cycle during the activation of the memory core;
when a read command is input as the commend for a second operation cycle of the each operation cycle, reading data to be read from a memory cell addressed by a read address which has been input for the second operation cycle;
performing ECC decoding of the thus read data using ECC data included in the read data and thus generating output data; and
making an adjustment to equalize a delay from input of the write command until activation of the memory core and a delay from input of the read command until activation of the memory core, by one of:
a delay circuit that makes the adjustment by generating a delayed clock by delaying a clock signal which is supplied from outside the semiconductor storage circuit, and supplying the delayed clock to the memory core, the ECC decoding being performed in sync with the delayed clock and a delay time of the delayed clock being set such that activation of the memory core will follow completion of the ECC encoding; and
a control circuit that makes the adjustment by generating a control signal for controlling an activation of the memory core, and supplying the control signal to the memory core.

13. The operation method of a semiconductor storage circuit according to claim 12, further comprising:
receiving the input data by a data input buffer in the semiconductor storage circuit in synch with the clock signal which is externally supplied and transferring the received input data to the memory core;
receiving the write address by an address input buffer in the semiconductor storage circuit in sync with the clock signal and transferring the received write address to the memory core; and
receiving the read address by the address input buffer in the semiconductor storage circuit in sync with the clock signal and transferring the received read address to the memory core,
wherein the making of the adjustment is by the delay circuit generating the delayed clock by delaying the clock signal, and
wherein the memory core is activated in sync with the delayed clock.

14. The operation method of a semiconductor storage circuit according to claim 12, wherein the write command comprises a first write command, and
wherein writing of the write data into the memory core in response to the first write command which has been input for the first operation cycle is performed when the memory core is activated in response to input of a second write command for a second operation cycle following the first operation cycle beginning with the input of the first write command.

* * * * *